(12) United States Patent
Harvey et al.

(10) Patent No.: US 6,275,037 B1
(45) Date of Patent: Aug. 14, 2001

(54) REMOVING DISCONTINUITIES IN MRI-SPACE DATA

(76) Inventors: Paul R. Harvey, 1 Hashoftim Street, Tel-Shalom, Karkoor 37074; Haim Rotem, Kfar-Kalil, D.N. Mateh-Asher, both of (IL)

( * ) Notice: Subject to any disclaimer, the term of this patent is extended or adjusted under 35 U.S.C. 154(b) by 0 days.

(21) Appl. No.: 09/152,198

(22) Filed: Sep. 14, 1998

(30) Foreign Application Priority Data

Sep. 15, 1997 (IL) ........................................................ 121775

(51) Int. Cl.⁷ ........................... G01R 33/20; A61B 5/055; G01V 3/00
(52) U.S. Cl. ............................................. 324/309; 324/307
(58) Field of Search .................................... 324/306, 307, 324/309; 706/25

(56) References Cited

U.S. PATENT DOCUMENTS

| | | | |
|---|---|---|---|
| 5,058,034 | 10/1991 | Murphy et al. | 706/25 |
| 5,167,232 | * 12/1992 | Parker et al. | 600/419 |
| 5,270,654 | 12/1993 | Feinberg et al. | 324/309 |
| 5,742,163 | * 4/1998 | Liu et al. | 324/309 |

\* cited by examiner

*Primary Examiner*—Christine Oda
*Assistant Examiner*—Tiffany A. Fetzner
(74) *Attorney, Agent, or Firm*—Hoffman, Wasson & Gitler, P.C.; Sanford T. Colb (57) ABSTRACT

A method is provided for removing discontinuities between the data of a first and second data set acquired in a k-space for a same MRI image of a subject, where the data for each of the data sets is acquired at k-coordinate points in adjacent regions of the k-space, using different MRI imaging techniques or operating conditions.

18 Claims, 6 Drawing Sheets

REMOVING DISCONTINUITIES IN MRI-SPACE DATA

FIELD OF THE INVENTION

The invention relates to the processing of k-space data in MRI imaging and to the removal of discontinuities in k-space data that occur at boundaries between sets of k-space data acquired for the same MRI image using different MRI techniques or operating conditions.

BACKGROUND OF THE INVENTION

In MRI imaging, a subject imaged is placed in a spatially and temporally varying magnetic field so that an imaging nucleus in the subject precesses around the magnetic field with a Larmor frequency $\omega(\vec{r}, t) = \gamma B(\vec{r}, t)$, where $\gamma$ is the gyromagnetic moment of the imaging nucleus and B is the magnitude of the magnetic field at time t and at a point $\vec{r}$ where the imaging nucleus is located. The dependence of the Larmor frequency on position is used to evaluate the spin density, $\rho(x,y,z)$, of the imaging nuclei as a function of position in the imaged subject. Since $\rho(x,y,z)$ is a function of the internal features and structures of the imaged subject these features and structures can be visualized.

The magnetic field B ($\vec{r}$, t) is generally of the form $B_0 + G_x x + G_y y + G_z z$ in a direction conventionally labeled as the z direction. $B_0$ is the magnitude of a large and constant homogeneous magnetic field parallel to the z direction, and $G_x$, $G_y$ and $G_z$ are the x,y, and z gradients of gradient fields, also parallel to the z axis, added to $B_0$. The time dependence of B ($\vec{r}$, t) is a function of the rise times of the gradients $G_x$, $G_y$, and $G_z$ and the timing sequence which governs when they are turned on and off.

A signal is elicited form the imaging nuclei by rotating their spins away from the z axis. This creates a component of spin density $\rho(x,y,z)$ and associated magnetization density, $m(x,y,z) = \gamma \rho(x,y,z)$ which rotate perpendicular to the z axis with a frequency equal to the Larmor frequency of the imaging nuclei. The rotating magnetic density produces a signal SIG(t) which is sensed by an appropriate receiving antenna.

The relationship between SIG(t) and the spin density $\rho(x,y,z)$ of the imaging nucleus can be written as $SIG(t) = \int\int\int \rho(x,y,z) \exp[i\gamma(B_0 + G_x x + G_y y + G_z z)t] \, dxdydz = \exp[i\omega_0 t] S(t)$, where $\omega_0 = \gamma B_0$ is the Larmor frequency of the imaging nucleus in $B_0$ and S(t) is the part of the integral dependent upon $\rho(x,y,z)$. In the relationship, the relaxation of the magnitude of the spin density in the transverse plane to zero and the recovery of the spin density equilibrium value along the z axis is ignored, and it has been assumed that the angle of rotation of $\rho(x,y,z)$ away from the z axis is $\pi/2$.

By changing variables so that $k_x = \gamma G_x t$, $k_y = \gamma G_y t$ and $k_z = \gamma G_z t$, S(t) can be written as a function of position in a "k-space". $S(t) \rightarrow S(k_x, k_y, k_z) = S(\vec{k})$, and:

$$S(\vec{k}) = \int\int\int \rho(x,y,z) \exp[i(k_x x + k_y y + k_z z)] dxdydz = \int\int\int \rho(\vec{r}) \exp[i\vec{k}\cdot\vec{r}] d^3 r.$$

This last integral is the Fourier transform of the spin density function $\rho(x,y,z)$ of the imaging nucleus. $S(\vec{k})$ is a "k-transform" of $\rho(x,y,z)$ and $\vec{k}$ and $\vec{r}$ are conjugate variables so that $\rho(\vec{r}) = \int\int S(\vec{k}) \exp[i\vec{k}\cdot\vec{r}] d^3 k$.

When the imaging nuclei are first flipped away from the z axis they precess together coherently with a net spin density and magnetization density in the xy plane. With time, however, the coherence in the transverse xy plane decays to zero and the spin density relaxes to the equilibrium state where the imaging nuclei are polarized along the z axis. The decay of net transverse spin density and return to equilibrium along the z axis are characterized by different time constants known as $T_2$ and $T_1$ respectively. When inhomogenities in the magnetic field are present, the decay of transverse spin density is accelerated and is characterized by a time constant known as $T_2^*$. The relaxation times are related by the inequality $T_2^* < T_2 < T_1$.

Many different techniques have been developed for MRI imaging. All involve procedures for acquiring values for the k-transform, $S(\vec{k})$, of a subject imaged at many points, hereafter "read-points", in a raster of points in k-space so that the Fourier transform of $S(\vec{k})$ results in a proper evaluation of $\rho(\vec{r})$.

Generally, the problem of evaluating $S(\vec{k})$ over three dimensions in k-space is reduced to a two dimensional one. The k-transform $S(\vec{k})$ is evaluated for a thin slice perpendicular to the z axis of the subject being imaged, so that $S(\vec{k}) \rightarrow S(k_x, k_y, Z_s)$ where $Z_s$ is the constant z coordinate of the slice. A three dimensional image is built up from the two dimensional images of many adjacent thin slices acquired for a range of values of $Z_s$.

Often, data for a k-transform $S(\vec{k})$, is acquired using different MRI imaging techniques or operating conditions in different areas of k-space. Ideally the values of data acquired should be independent of data acquisition method. Sets of data acquired for a same k-transform $S(\vec{k})$ using different techniques or operating conditions therefore should be consistent with each other. Consistency requires that, at boundaries between two areas in k-space where data for a k-transform is acquired in one of the k-space areas using a technique or conditions different from the technique or conditions used to acquire data for the same k-transform in the other k-space area, the data on either side of the boundaries approach the same values for points on the boundaries i.e. the data must be continuous at the boundaries.

If the data is not consistent, and has discontinuities at boundaries, the discontinuities cause artifacts such as ghosting or ringing. The scale and seriousness of the artifacts is an increasing function of the slope and magnitude of the discontinuities. These seriously degrade an MRI image constructed from the k-transform and generally, solutions are needed to remove or moderate them.

Many discontinuities and sources of discontinuities are removed by standard normalization and calibration procedures. These procedures remove from the data equipment biases and many types of timing errors. Additional corrections to the data are made by dividing out the $T_1$ and $T_2$, decay envelope from the data. Finally, data is corrected for $T_2^*$ effects arising from chemical shift and field inhomogenities.

Chemical shift and field inhomogeneity often lead to large discontinuous phase differences between data on opposite sides of a boundary between data sets acquired using different MRI techniques or operating conditions. This occurs when data on opposite sides of the boundary are acquired at significantly different echo times $T_E$. The phase differences are proportional to the time difference between the echo times and the magnitudes of the chemical shift fields and the field inhomogenities.

One way to remove chemical shift and field inhomogeneity effects is to acquire all data at the same $T_E$ time. This is not possible except with the standard MRI spin echo technique. This technique however is slow and therefore not suitable for many procedures. The new fast imaging techniques must contend with chemical and field inhomogeneity phase effects.

It is possible to consider mathematically removing these effects. Removing the chemical shift and field inhomogeneity effects from the data mathematically requires the acquisition of data additional to the basic k-transform data, such as a magnetic field homogeneity map. This is often impractical or not possible.

Often chemical shift and field inhomogeneity effects are not removed from the data but are prevented from accumulating and concentrating along the boundary. In this way any discontinuities that they might cause are significantly reduced.

This is generally done in prior art by a technique called echo time shifting. In echo time shifting, the $T_E$ times of echo pulses and their associated read gradients in an MRI imaging sequence are shifted so as to prevent a large difference in echo time $T_E$ from appearing between k-transform data acquired at adjacent read points. Since the phase difference between data points due to chemical shift and field inhomogeneity is proportional to the difference between the $T_E$ times at which they were taken, this approach prevents any large discontinuous phase shifts caused by chemical shift and field inhomogeneity from occurring in the k-transform data.

For example, assume a phase discontinuity occurs in the data of a k-transform that causes severe ghosting or ringing in the image constructed from the k-transform. Assume that the phase shift is caused by chemical shift and field inhomogeneity, and that it occurs across a boundary common to a first and a second data subset of a k-transform. Let $\phi$, be the phase difference and assume it results from an echo time difference $\Delta T_E$, between the echo time at which the data at the boundary in the first data set is acquired and the echo time at which the data at the boundary for the second data set is acquired. Further assume that the data in the first data set is acquired using n read gradients, with the data at the boundary from the first data set coming from the n-th read gradient.

To prevent or reduce this discontinuity, the time interval between the n consecutive read gradients used to accumulate data in the first data set is increased by $\delta T_E = \Delta T_E/n$. As a result, the second of the n consecutive read gradients is shifted in time by $\delta T_E$, the third by $2\delta T_E$, the fourth by $3\delta T_E$, and so on, with the n-th read gradient shifted by $(n-1)\delta T_E$. The chemical and field inhomogeneity phase difference between each of the n read gradients in the first data set is increased by $\phi/n$ and the phase difference at the boundary between the data sets is decreased by a factor of n to $\phi/n$. The phase difference has not been removed, it has been redistributed over the data by echo time shifting. The phase difference at the boundary has been decreased by a factor of n at the expense of increasing the phase difference between data taken from consecutive read gradients used for the first data set by $\phi/n$. The discontinuity at the boundary has been substantially removed and if phase differences on the order of $\phi/n$ do not cause ghosting or ringing the image reconstructed from the k-transform is improved.

The problem of discontinuities in data at boundaries often arises in procedures which use echo planar imaging sequences (EPI) to acquire k-transform data. EPI sequences generally require very large, rapidly changing gradient fields and wide band receivers. These fields and their time derivatives may exceed limitations established to prevent their causing undesirable biological effects. Additionally, the sequence is generally very strongly affected by $T_2^*$ decay, so that as the sequence progresses, the signal to noise ratio decreases. Both of these problems are moderated by decreasing the duration of the sequence. As a result, when data for a k-transform of a subject is acquired in a k-space using EPI, the data is often acquired using a set of short EPI sequences instead of one single long EPI sequence. The k-space is partitioned into different parts, hereafter "read sectors", and each shortened EPI sequence acquires data in a different read sector. A boundary is created where one read sector ends and another begins.

In order to combine the data from these shortened EPI sequences into one consistent data set, the data of a k-transform must be continuous across read sector boundaries. This requires that the data for each read sector be calibrated and normalized and corrected for $T_2$ decay and chemical shift and field inhomogeneity.

GRASE imaging is another MRI imaging technique that creates boundaries between sets of data acquired for a same k-transform $S(k_x,k_y)$, of a subject imaged. A GRASE imaging sequence employs a 90° RF slice selection pulse followed by N GRASE cycles, where each GRASE cycle comprises a 180° RF spin focusing pulse and associated selection gradient pulse, followed by M read gradient pulses with alternating polarity, during which data is acquired. For each GRASE cycle for $S(k_x,k_y)$ data is acquired for M complete read lines. Phase encoding to determine the $k_y$ coordinate of read lines scanned in a GRASE cycle is accomplished with a series of variable magnitude phase gradient pulses, generally coincident with the zero crossing points between read gradient pulses. A single, complete GRASE Thus, the method of removing k-space discontinuities of the patent of Liu et al fails to provide the following elements of the claims of the application:

determining a width for a transition zone in the k-space at and including the boundary;

calculating bridging data from data in the overlap data set for k-coordinates in the transition zone; and replacing data at k-coordinates in the transition zone with bridging data, discusses GRASE imaging and illustrates the way in which GRASE imaging divides k-space into different data acquisition areas.

All the data acquired in a particular read sector is generally acquired from a same read gradient pulse of repeated GRASE cycles, e.g. all the data for read points in the third read sector are acquired from the third read gradient of repeated GRASE cycles. As a result, the data in each read sector are all acquired at a same unique echo time $T_E$, which is different from the $T_E$ at which data is acquired for any of the other read sectors. There is therefore, no difference in phase from chemical shift and field inhomogeneity between different data belonging to a same read sector, but there is a difference in phase arising from chemical shift and field inhomogeneity between data belonging to different read sectors. Each read sector has its own unique chemical shift and field inhomogeneity phase offset which is different from the chemical shift and field inhomogeneity phase offset of other read sectors. Therefore, the data in each read sector exhibits $T_2$ decay but not $T_2^*$ decay while the data from different read sectors taken with a same GRASE cycle exhibit $T_2^*$ decay.

In order for the data from the different read sectors to be combined into a single consistent set of data continuous at the boundaries between read sectors the data in each read sector has to be normalized, corrected for $T_2$ decay, and for chemical shift and field inhomogeneity.

In both examples even after the appropriate normalization, calibration and correction procedures are carried out, the data at boundaries may sometimes still exhibit discontinuities in phase and or in magnitude. In addition, echo time shifting techniques for preventing or ameliorating discontinuities arising from chemical shifts and field inhomogenities require special software and hardware that is expensive and frequently not available.

It would therefore be desirable to have a simple mathematical procedure to remove or reduce discontinuities that occur at boundaries between data subsets of a k-transform that are caused by chemical shifts and field inhomogenities and that persist after standard normalization, calibration and $T_2$ decay corrections on the data are carried out.

SUMMARY OF THE INVENTION

It is an object of the present invention to provide a method for reducing artifacts in an image constructed from a k-transform, $S(k_x,k_y)$, which comprises data subsets and where the data in each data subset is acquired using a different MRI imaging technique and/or operating conditions, at read points in a region of k-space specific to and exclusive to that data subset. A region in k-space where data is acquired for a particular data subset has an area and boundaries, hereinafter the area of the subset and boundaries of the subset. A boundary between adjacent data subsets is a boundary common to both adjacent data subsets or a line between boundaries of the adjacent data subsets. The artifacts are caused by discontinuities in the data of $S(k_x,k_y)$ that occur at or in the region of boundaries between adjacent data subsets.

A method according to some aspects of the present invention is an alternative to echo shifting in recognizing that the discontinuities that are sharp or very abrupt phase transitions arising from chemical shift and field inhomogenities cause most of the image artifacts. The method smoothes out these transitions, reducing their "sharpness" and thereby reducing the artifacts they cause.

This is done by defining k-space transition zones at boundaries between adjacent data subsets. The data acquisition process is modified so that preferably, data is acquired twice in the transition zones, once for each data subset at or adjacent to the boundary in a transition zone, i.e. the data subsets overlap in transition zones. The overlapping data is then preferably merged, preferably using a simple weighting filter in order to smooth the transition in both phase and magnitude at the boundary between the data subsets.

In accordance with a preferred embodiment of the present invention transition zones are defined at boundaries between adjacent data subsets of $S(k_x,k_y)$. Data from the adjacent data subsets at read points in each transition zone are discarded and replaced with data (hereafter "transition data") calculated to provide a substantially continuous "bridge" across the transition zone from data in one subset, at read points along one edge of the transition zone, to data in the other subset at read points along the opposite edge of the transition zone.

It is an object of some aspects of the present invention to provide for a method for calculating transition data for a transition zone between adjacent data subsets of $S(k_x,k_y)$.

It is a further object of some aspects of the invention to provide data for calculating the transition data. The data for calculating the transition data is preferably provided by modifying the data acquisition procedure so that data in the transition zone is preferably acquired using the methods and/or operating conditions of both adjacent data subsets.

In accordance with a preferred embodiment of the present invention a width is determined for a transition zone at a boundary between two data subsets of a k-transform $S(k_x,k_y)$ of a subject to be imaged. The data in the subsets are acquired at read points in adjoining areas of a k-space using different MRI imaging techniques and/or operating conditions. Data for the k-transform is preferably acquired at read points in the transition zone using the MRI imaging techniques and/or operating conditions of both data subsets. Both data subsets thereby preferably extend into and overlap in the transition zone. Preferably, the data acquired in the transition zone for both subsets are acquired at identical read points in the transition zone.

Since the overlapping data from both subsets refer to the same area of k-space, and preferably the same read points in k-space, they should be substantially the same. Differences that do exist between them are a direct measure of the magnitude of discontinuities arising, in the region of the boundary, not from the imaged subject, but from inadequacies or errors in the MRI methods or operating conditions used to acquire the data. The overlapping data therefore form an appropriate data base from which to estimate the magnitude of the error degrading the data at the boundary. They also form an appropriate data base from which to calculate transition data for $S(k_x,k_y)$ in the transition zone.

In some preferred embodiments of the present invention the width of the transition zone is determined from the areas of the adjacent data subsets. Preferably, the width of the transition zone is determined so that the area of the transition zone is a fraction of the area of one of the adjacent data subsets. In some preferred embodiments of the invention, the area of the transition zone is a fraction of the smaller of the two adjacent data subsets. In other preferred embodiments, the area of the transition zone is a fraction of the larger of the two adjacent data subsets. In still other preferred embodiments of the present invention, the area of the transition zone is a fraction of the average of the areas of the two adjacent data subsets.

Preferably, the fraction is greater than 0.1. Preferably, the fraction is in the range from 0.05 to 0.5. Most preferably the fraction is in the range from 0.2 to 0.3. Preferably the fraction is substantially equal to 0.25.

The width of the transition zone, in comparison to the differences between the overlapping data, determines the slope characterizing the transition data bridging the data from the two data subsets. The slope of the transition data determines the amount by which artifacts arising from discontinuities in the data at the boundary are moderated. The smaller the slope, i.e., the less "steep", the smoother the transition between the data from the two data subsets and the smaller the artifacts.

In some preferred embodiments of the present invention, the width of the transition zone is determined from the difference between overlapping data, or data adjacent to opposite sides of the transition zone, so that the slope is less than a predetermined value.

In other preferred embodiments of the present invention the width of the transition zone is determined by adjusting the width of the transition zone so that an image constructed from $S(k_x,k_y)$ is optimized.

Transition data for $S(k_x,k_y)$ in the transition zone, are preferably calculated by calculating a weighted average using values of $S(k_x,k_y)$ from the two data subsets, at or near to the read point in the transition zone for which the transition data of $S(k_x,k_y)$ is calculated.

There are various weighting functions that can be used to calculate the transition data. Since the transition zone is defined by its width and its length, the weighting function can generally be written as a function of position with respect to the center of the width of the transition zone and with respect to the location of the center of the width along the length of the transition zone measured from an end of the transition zone. In some preferred embodiments of the invention the weighting function is dependent only upon position with respect to the width of the transition zone.

For example, assume that the transition zone is a strip of area in k-space of width, w, parallel to the $k_x$ axis, with the center of the strip at $k_y=k_0$, and that w, and the weighting function, are independent of position along the length of the transition zone. Let $S_1(k_x,k_y)$ and $S_2(k_x,k_y)$ denote the two data subsets of $S(k_x,k_y)$ that overlap in the transition zone. Let $S_1(k_x,k_y)$ be the data subset which has data acquired at read points for which $k_y \geq k_0+w/2$ and $S_2(k_x,k_y)$ the data subset which has data acquired at read points for which $k_y \leq k_0-w/2$. If $\overline{S}(k_x,k_y)$ is the value of the transition data for $S(k_x,k_y)$ at read point $(k_x,k_y)$ in the transition zone, then using a linear weighting function, $\overline{S}(k_x,k_y)=[(k_y-k_0)/w+1/2] \times S_1(k_x,k_y)+[(k_0-k_y)/w+1/2] \times S_2(k_x,k_y)$.

It should be realized that transition data for a transition zone can be determined in the case where data from the two data subset do not overlap, or when there is a gap between borders of the two data subsets in the transition zone. Preferably, this is performed by linear interpolation between data from the two data subsets on opposite edges of the transition zone.

There is therefore provided in accordance with a preferred embodiment of the present invention a method for removing discontinuities between the data of a first and second data set acquired in a k-space plane for a same MRI image of a subject, where the data for each of the data sets is acquired at k-coordinate points in different, but adjacent areas of the k-space plane, using different MRI imaging techniques or operating conditions, and where the discontinuities occur at k-coordinates along a boundary between the adjacent areas of the k-space plane, comprising: (a) determining a width for a transition zone in the k-space plane, at and including, the boundary; and (b) replacing data at k-coordinates in the transition zone with bridging data that provide a continuous transition from data of the first data set at k-coordinates outside of and along an edge of the transition zone to data of the second data set at k-coordinates outside of and along the opposite edge of the transition zone.

Preferably, replacing data in the transition zone with bridging data comprises: (a) acquiring a first transition data set at coordinate points in the transition zone using the MRI imaging technique or operating conditions of the first data set and acquiring a second transition data set in the transition zone at coordinate points in the transition zone using the MRI imaging technique or operating conditions of the second data set; and (b) calculating the bridging data using data from the first and second transition data sets for a plurality of k-coordinates in the transition zone.

Preferably, the data for the first and second transition data sets are acquired at substantially coincident k-coordinates in the transition zone.

Calculating bridging data for a particular k-coordinate in the transition zone, preferably comprises calculating a weighted average between data from the first transition data set and data from the second transition data set using a weighting function. Preferably, the weighting function is a linear weighting function.

In some preferred embodiments of the present invention different operating conditions comprises using the same MRI technique at different separate time periods.

There is further provided in accordance with a preferred embodiment of the present invention a method for removing discontinuities between the data of a first and second data set acquired in a k-space plane for a same MRI image of a subject, where the data for each of the data sets is acquired at k-coordinate points in different, but adjacent areas of the k-space plane, using different MRI imaging techniques or operating conditions, and where the discontinuities occur at k-coordinates along a boundary between the adjacent areas of the k-space plane, comprising: (a) acquiring data for an overlap data set at k-coordinates in an overlap zone along the boundary, in at least one of the adjacent areas of the k-space plane, using the MRI technique or operating conditions used to acquire data in the other adjacent area of the k-space plane; (b) calculating bridging data from data in the overlap data set for k-coordinates in the overlap zone that provide a continuous transition from data of the first data set at k-coordinates outside of and along an edge of the overlap zone to data of the second data set at k-coordinates outside of and along the opposite edge of the overlap zone; and (c) replacing data from the first and second data sets at k-coordinates in the overlap zone with bridging data.

Preferably, data for the overlap data set is acquired at k-coordinates substantially coincident with the k-coordinates of data in the overlap zone from the first or second data sets.

Calculating bridging data for a particular k-coordinate in the transition zone preferably comprises calculating a weighted average between data in the overlap zone acquired using the MRI imaging technique or operating conditions of the first data set and data acquired in the overlap zone using the MRI imaging technique or operating conditions of the second data set using a weighting function. Preferably, the weighting function is a linear weighting function.

In some preferred embodiments of the present invention different operating conditions comprises using the same MRI technique at different separate time periods.

BRIEF DESCRIPTION OF FIGURES

The invention will be more clearly understood by reference to the following description of preferred embodiments thereof in conjunction with the figures, wherein identical structures, elements or parts which appear in the figures are labeled with the same numeral, and in which.

DETAILED DESCRIPTION OF PREFERRED EMBODIMENTS

Figure 1A:
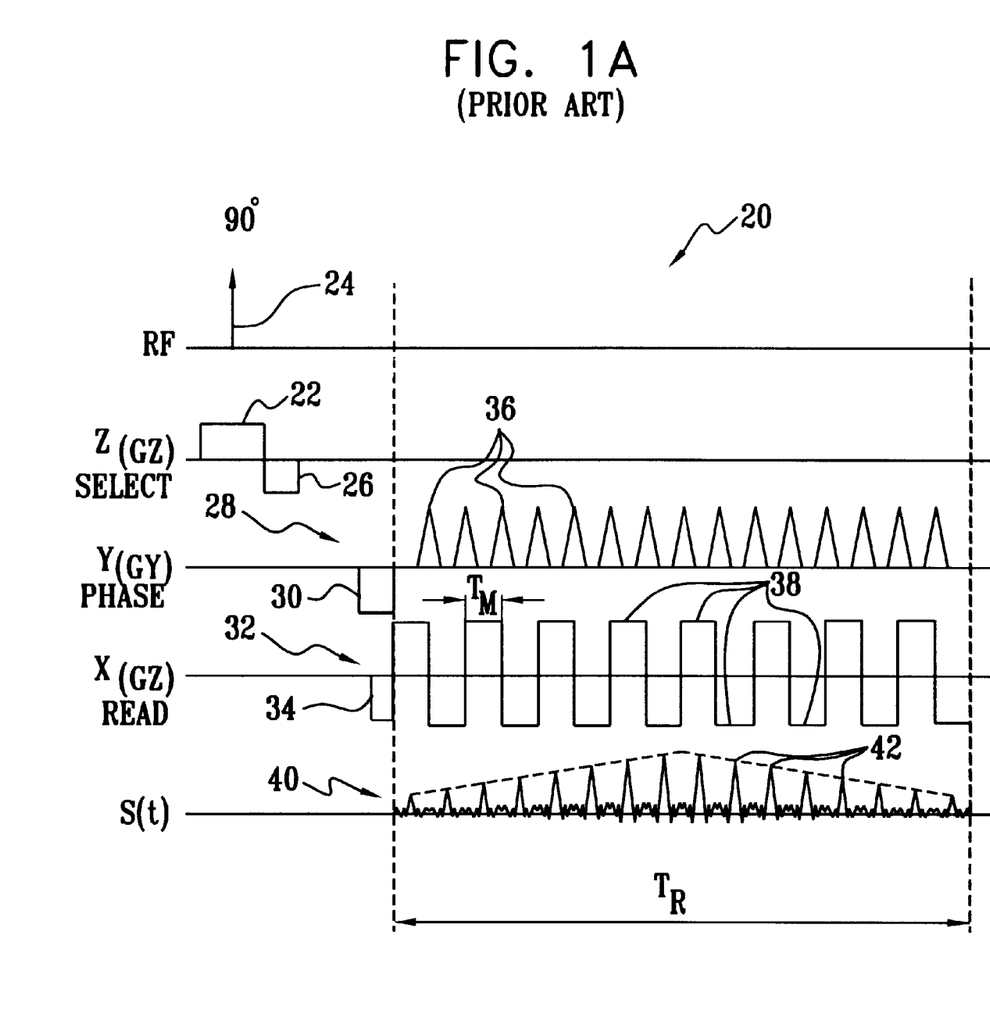
FIG. 1A shows a conventional EPI imaging sequence used in a multi-shot EPI imaging technique.

FIG. 1A shows an EPI sequence 20, used in a multi-shot EPI technique, for acquiring data for a two dimensional k-transform $S(k_x,k_y)$ of a slice of a subject being imaged. EPI sequence 20 acquires, in one repetition of duration $T_R$, data at N×M read points in a plane of k-space. An RF slice selection pulse 24 and a selection gradient field 22 and 26 are applied to the subject to select the slice to be imaged. Data is taken using a phase encoding gradient 28, comprising N-1 phase pulses 36, and a read gradient 32, comprising N read pulses 38, of constant magnitude and alternating sign. Phase encoding gradient 28 and read gradient 32 comprise registration pulses 30 and 34, respectively, which set the k-space coordinates of the first read point at which data is acquired by EPI sequence 20. A data signal 40, comprises a pulse train of N data echo pulses 42, one for each read pulse 38. With each read pulse 38, a set of M data values for $S(k_x,k_y)$ is acquired at M equally spaced points on a read line in k-space parallel to the $k_x$ axis.

Figure 1B:
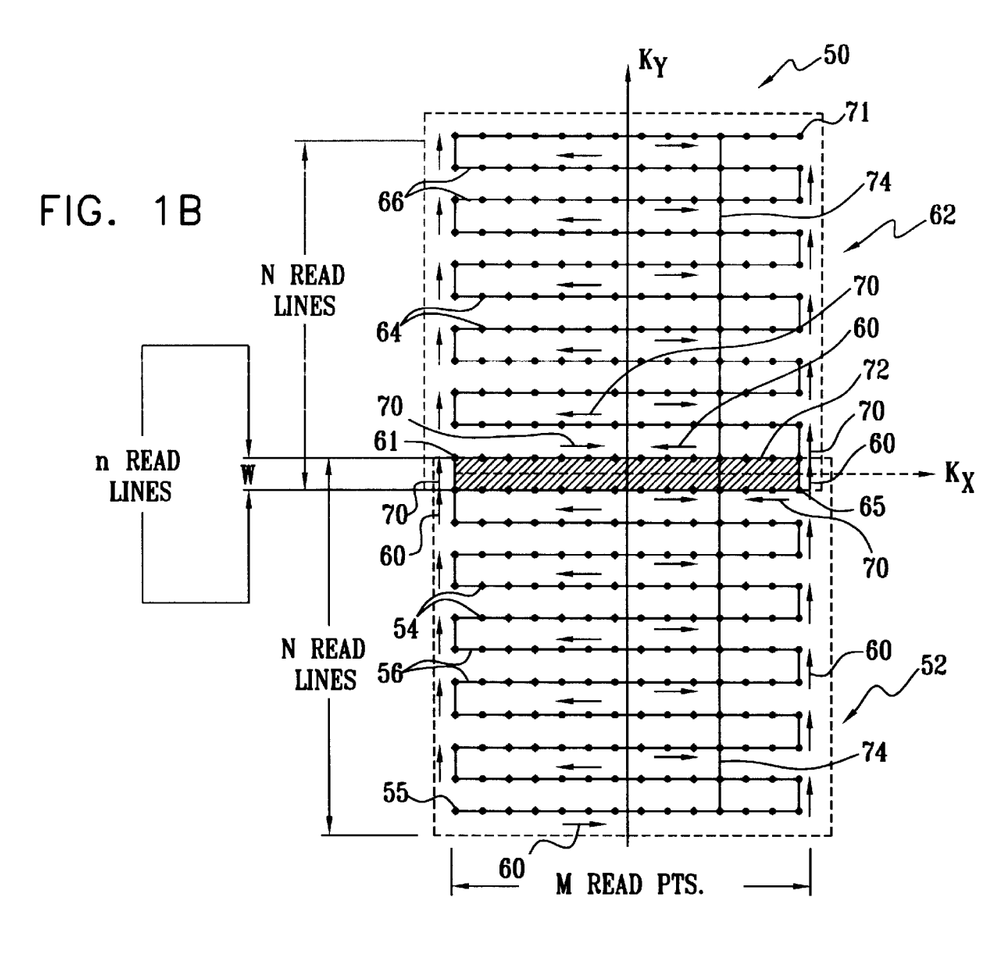
FIG. 1B shows a schematic of a raster of read points scanned with a multi-shot EPI technique in accordance with a preferred embodiment of the present invention.

FIG. 1B shows a schematic of a raster of 2×N×M read points in a k-plane 50, at which data for $S(k_x,k_y)$ is acquired using a multi-shot EPI technique having two repetitions of EPI sequence 20. The multi-shot EPI technique shown is modified in accordance with a preferred embodiment of the present invention to create a transition zone 72, where data acquired by the first and second repetitions of EPI sequence 20 overlap.

Figure 1C:
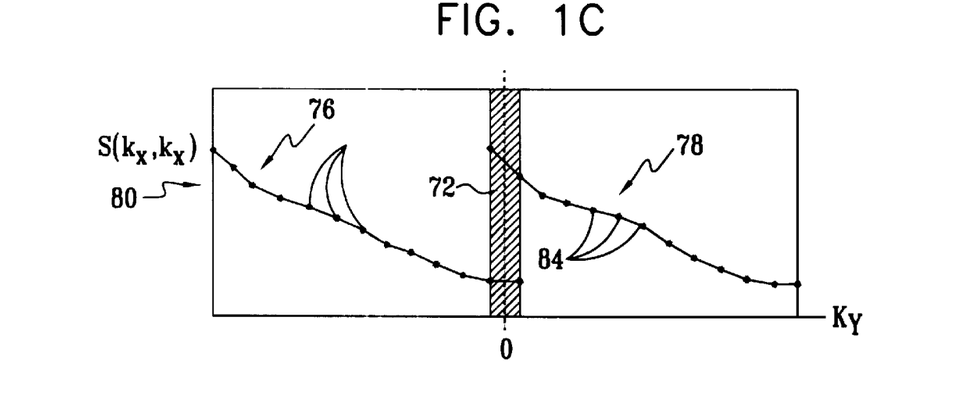
FIG. 1C shows a graph of simulated data acquired from a scan of the read points in FIG. 1B.
Figure 2A:
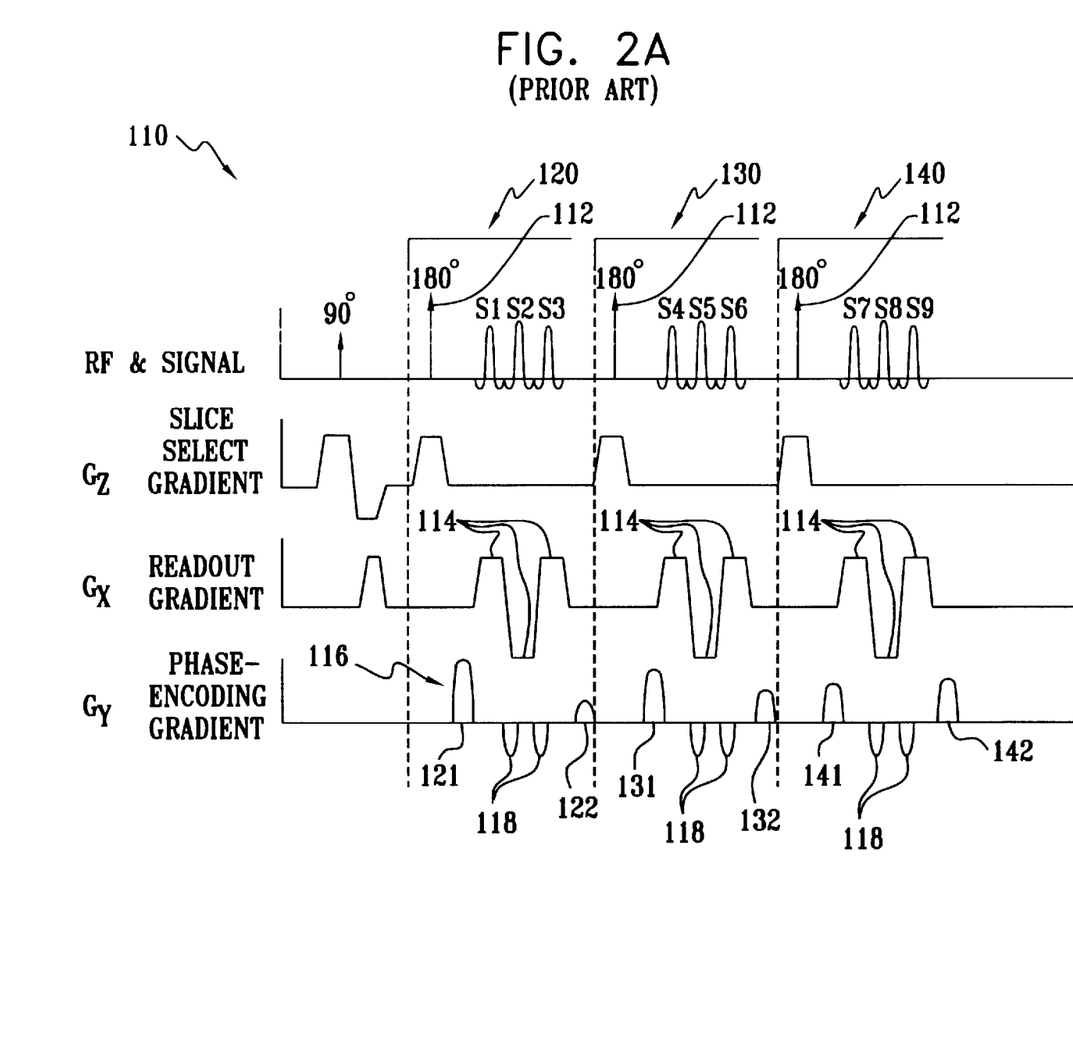
FIG. 2A shows a conventional GRASE imaging sequence.
Figure 2B:
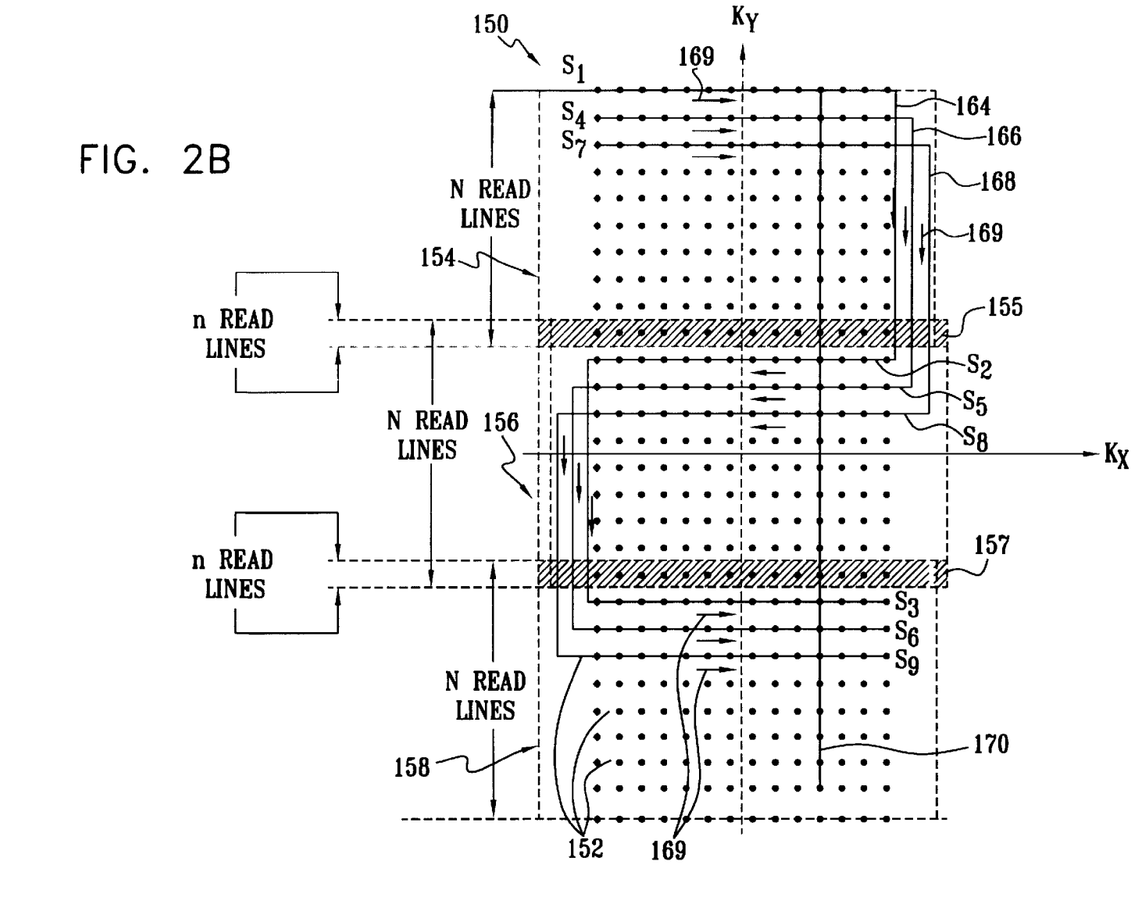
FIG. 2B shows a schematic of a raster of read points scanned with a GRASE technique in accordance with a preferred embodiment of the present invention.
Figure 2C:
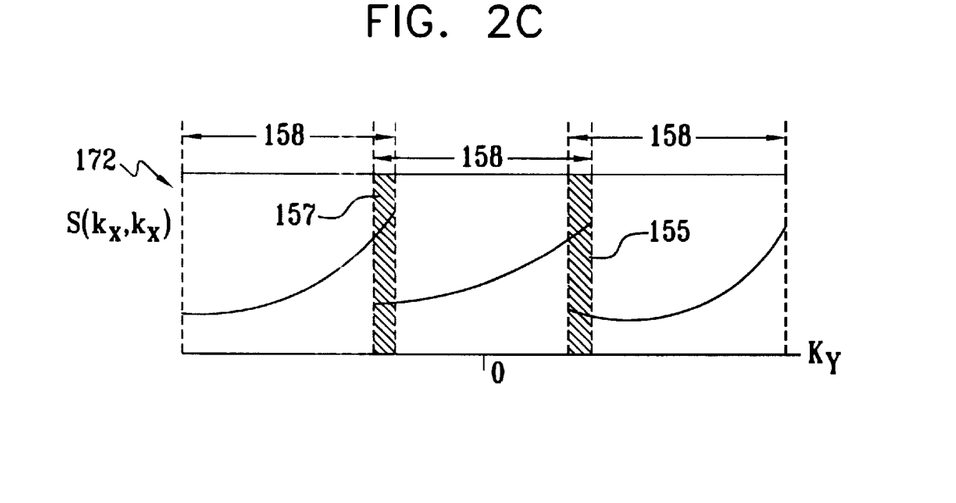
FIG. 2C shows a graph of simulated data acquired in a scan of the read points of FIG. 2B.
Figure 2D:
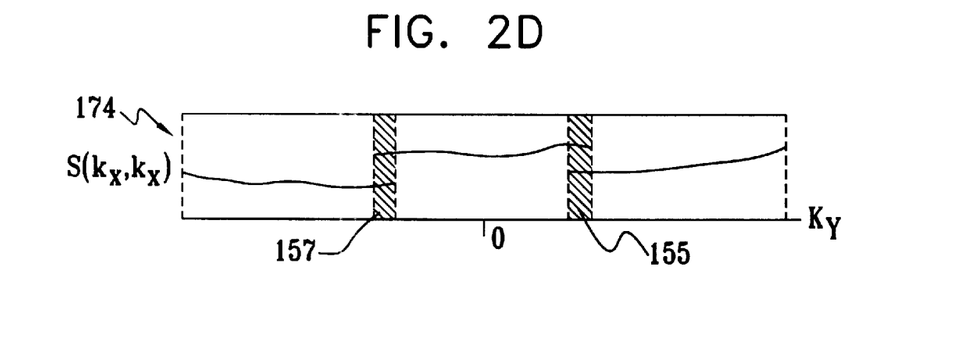
FIG. 2D shows a graph of the data corrected for $T_2$ decays.
Figure 2E:
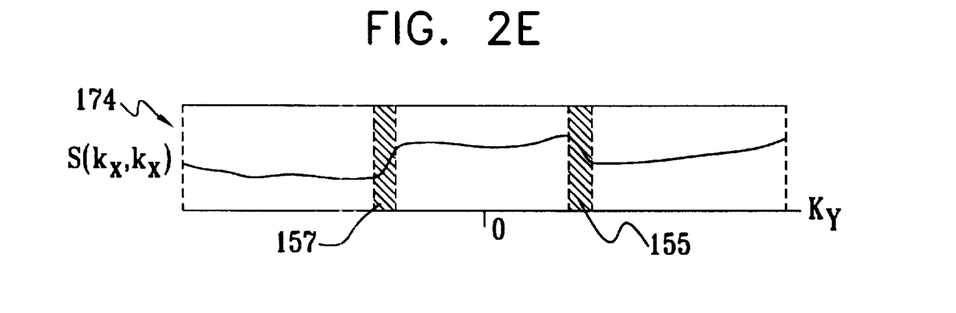
FIG. 2E shows a graph of the data after removal of discontinuities in accordance with a preferred embodiment of the present invention.

FIG. 1C shows a graph 80, of simulated data for $S(k_x,k_y)$ acquired at read points shown in FIG. 1B using a multi-shot EPI sequence in accordance with a preferred embodiment of the present invention;

FIG. 2D shows a graph 94 of the data after normalization and correction for $T_2$ decay; and FIG. 2E shows a graph 95 showing the data after removal of discontinuities arising from chemical shifts and field inhomogeneities in accordance with a preferred embodiment of the present invention A first repetition of an EPI sequence acquires data in a read sector 52, of k-plane 50, and a second repetition of an EPI sequence acquires data in a read sector 62 of k-plane 50. (The dashed outline indicating read sectors 52 and 62 are shown slightly displaced from each other for clarity). Data from read sector 52 is acquired sequentially at read points 54 along a read trajectory starting at read point 55 and moving in the direction indicated by arrows 60 along N read lines 56 to an end read point 61. Data in read sector 62 is similarly acquired at read points 64 along a trajectory starting at read point 65 and moving in the direction indicated by arrows 70 on N read lines 66 to an end read point 71.

In accordance with a preferred embodiment of the present invention, read sectors 52 and 62 do not abut each other along a boundary line, but preferably, overlap in transition zone 72. Transition zone 72 is preferably centered on the $k_x$ axis and preferably has a width, w, in k-space that includes n read lines. Preferably read points 54, belonging to read sector 52, and read points 64, belonging to read sector 62, are substantially congruent in transition zone 72.

Preferably, n is greater than 0.05×N. Preferably, n is in the range from 0.05×N to 0.5×N. Most preferably n is in the range from 0.2×N to 0.3×N. Preferably, n is substantially equal to 0.25×N. Alternatively or additionally, the width of transition zone 72 is determined from differences between data from read sectors 52 and 62 in transition zone 72. Further alternatively or additionally, the width of the transition zone 72 is determined by adjusting the width of transition zone 72 so that an image constructed from $S(k_x,k_y)$ is optimized.

Values for $S(k_x,k_y)$, along a line 74 parallel to the $k_y$ axis, acquired from the first repetition of EPI sequence 20 (data from read sector 52) and the second repetition of EPI sequence 20 (data from read sector 62) are graphed respectively as functions of $k_y$ in curves 76 and 78 in graph 80. Points 82 on curve 76 and points 84 on curve 78 represent the values of $S(k_x,k_y)$ for the $k_y$ coordinate of the read points along line 74 to which they are opposite. Both curves 76 and 78 extend into transition zone 72. The decreasing magnitude of the data in each graph is due to $T_2^*$ decay.

Figure 1D:
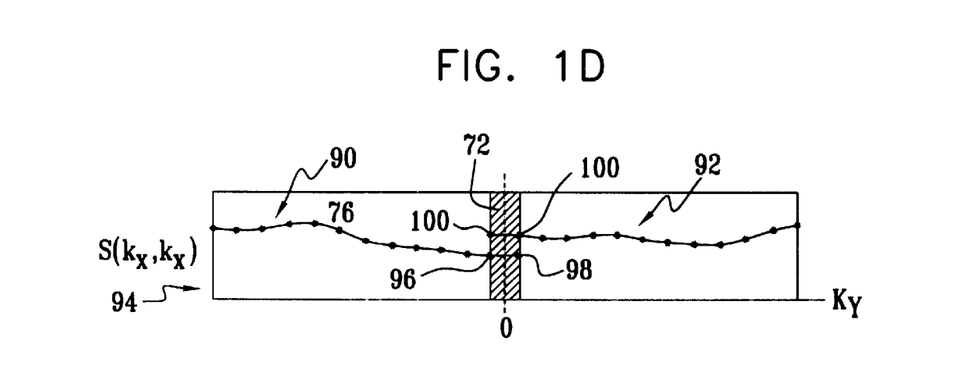
FIG. 1D shows a graph of the data corrected for $T_2$ decay.
Figure 1E:
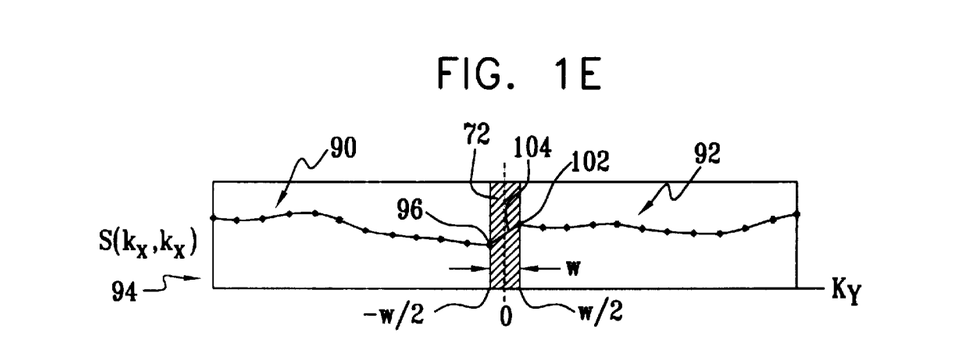
FIG. 1E shows a graph of the data after removal of discontinuities in accordance with a preferred embodiment of the present invention.

The data from curves 76 and 78, following normalization and calibration and correction for $T_2$ decay are graphed in curves 90 and 92 respectively of graph 94. Data points on curve 90 between data points 96 and 98 and data points on curve 92 between data points 102 and 100 represent data acquired in transition zone 72, preferably at congruent read points. The section of curve 92 between data points 102 and 100 and the section of curve 90 between 96 and 98 should therefore be congruent. They are not however, because the data is affected by chemical shifts and field inhomogenities and by errors and inaccuracies that affect the two repetitions of EPI sequence 20 differently and that persist following normalization and calibration. As a result the data for $S(k_x,k_y)$ in and near to transition zone 72 is discontinuous, and unless modified, would give rise to artifacts in an image constructed from $S(k_x,k_y)$ Graph 95 shows the differences in the data from curves 90 and 92 in the transition zone, resolved in accordance with a preferred embodiment of the present invention. Data from curves 90 and 92 in the transition zone are replaced by transition data represented by curve segment 104 between data points 96 and 102, in accordance with a preferred embodiment of the present invention, which provides for a smooth continuous transition from data point 102 to data point 96. The value of the transition data at a point in transition zone 72 in accordance with a preferred embodiment of the present invention is preferably equal to a weighted average of the data from curves 90 and 92 at the point in transition zone 72.

Let the transition data at read points along line 74 (FIG. 1B) in transition zone 72, which is represented by curve segment 104, be $\overline{S}(74,k_y)$. Let the data along line 74 represented by curves 90 and 92 in transition zone 72 be denoted respectively by $S90(74,k_y)$ and $S92(74,k_y)$. Further assume a weighting function W, preferably a function of $k_y$ only is used to calculate the weighted average so that $W=W(k_y)$ where $0 \leq W(k_y) \leq 1$, $W(w/2)=0$ and $W(-w/2)=1$. Then $\overline{S}(74,k_y)=S90(74,k_y) \times W(k_y)+S92(74,k_y) \times [1-W(k_y)]$.

GRASE imaging sequences naturally group data into distinctive data subsets as they acquire data in k-space. These subsets share mutual boundaries which exhibit continuity problems similar to those discussed above for multi-shot EPI sequences.

FIG. 2A shows a GRASE sequence 110 comprising 3 GRASE cycles 120, 130, and 140 beginning with 180° RF focusing pulses 112, and comprising three read gradients 114, each, of alternating polarity. Data is acquired from signal pulses labeled S1 through S9 for nine read lines in k-space during the nine read gradient pulses 114 comprised in one repetition of GRASE sequence 110. Phase encoding for setting the $k_y$ coordinates of the read lines is accomplished by a phase pulse train 116 comprising variable magnitude and polarity gradient pulses 118, 121, 122, 131, 132, 141, and 142. Phase gradient pulses 121, 131, and 141, of decreasing magnitude with respect to each other, set the $k_y$ coordinates for the first read line scanned during each of GRASE cycles 120, 130, and 140, respectively. Phase gradient pulses 122, 132, and 142, of increasing magnitude with respect to each other, reset the $k_y$ coordinate to 0 at the end of each GRASE cycle 120, 130, and 140 respectively, and phase gradients 118 define the spacing between read lines. There are many different configurations for phase gradient pulse train 116 that permit different read line spacings and data acquisition trajectories in k-space and these will occur to persons of the art.

FIG. 2B shows a raster of read points on 3N+1 read lines 152 in an area 150 of k-space. Read lines 152 are scanned in N+1 repetitions of GRASE sequence 110 (FIG. 2A) to acquire data for a k-transform $S(k_x,k_y)$. K-space 150 comprises three read sectors 154, 156, and 158 comprising N read lines each. The GRASE technique shown in FIG. 2A has been modified in accordance with a preferred embodiment of the present invention so that read sectors 154 and 156, and read sectors 156 and 158 of FIG. 2B do not butt up against each other but overlap each other in transition zones 155 and 157 respectively. Transition zones 155 and 157 preferably have a width, w, and contain n read lines 152. FIG. 2B is not to scale but has been drawn for the purpose of ease and clarity of presentation.

Preferably, n is greater than 0.05×N. Preferably, n is in the range from 0.05×N to 0.5×N. Most preferably n is in the range from 0.2×N to 0.3×N. Preferably, n is substantially equal to 0.25×N. Alternatively or additionally, the width of transition zone 155 is determined from differences between data from read sectors 154 and 156 in transition zone 155 and the width of transition zone 157 is determined from differences between data from read sectors 156 and 158 in transition zone 157, so that transition data calculated for transition zones 155 and 157 have a slope less than a predetermined value. Further alternatively or additionally, the width of the transition zones 155 and 157 are determined by adjusting the width of transition zones 155 and 157 so that an image constructed from $S(k_x,k_y)$ is optimized.

GRASE cycles 120, 130 and 140 are repeated in each repetition of GRASE sequence 110. In the first repetition of GRASE sequence 110 the magnitudes of the phase gradients in phase pulse train 116 are chosen so that data is acquired sequentially, in the direction indicated by arrows 169, at read points along identically shaped read trajectories 164, 166, and 168 respectively. Data for the rest of the read points in k-area 150 are acquired in N more repetitions GRASE sequence 110 along 3N more read trajectories identical in shape to read trajectories 164, 166 and 168. Each read trajectory is displaced from the read trajectory of the previous GRASE cycle by one read line along the $k_y$ axis. The signal pulse from which data is acquired for a read line scanned during the first repetition of GRASE sequence 110 is noted near an end of the read line.

The data at read points on read lines in read sector 156 are acquired from the middle signal pulses (i.e. S2, S5, S8) of each GRASE cycle and for read points on read lines in sectors 154 (i.e. S1, S4, S7) and 158 (i.e. S3, S6, S9) data is acquired from the first and third signal pulses in a GRASE cycle respectively. As a result, data from sequential read points belonging to a single read sector will exhibit $T_2$ decay but not $T_2^*$ decay. Data in read sector 156 will have the largest magnitudes because the middle signal pulse in each GRASE cycle is maximally focused by the 180° RF focusing pulse 112 (FIG. 2A) which begins each GRASE cycle.

FIGS. 2C–2E show simulated data acquired at read points in read sectors 154, 156 and 158 shown in FIG. 2B. The data is acquired using N+1 repetitions of GRASE sequence 110 FIGS. 2C–2E. FIG. 2C also schematically shows the removal of discontinuities from the data, in accordance with a preferred embodiment of the present invention.

Data for $S(k_x,k_y)$ at data points along a line 170 for read sectors 154, 156 and 158, and transition zones 155 and 157 in area 150 are shown in graph 172 in FIG. 2C. The shape of the data curve for each of the read sectors is due to $T_2$ decay and the difference between the magnitudes of the data taken at corresponding read lines in the read sectors is due to $T_2^*$ decay. The data, normalized and corrected for $T_2$ decay is graphed in graph 174 (FIG. 2D) for each of the read sectors. As in the previous example of multi-shot EPI, so in this example of GRASE, the data, after normalization and correction for $T_2$ is not continuous in transition zones 155 and 157. Graph 176 (FIG. 2E) shows the data of graph 174 after the discontinuities are removed using methods presented in the discussions of FIGS. 1A–1E, in accordance with a preferred embodiment of the present invention.

The present invention has been described using a non limiting detailed description of a preferred embodiment thereof. Variations of the embodiment described will occur to persons of the art. The detailed description is provided by way of example and is not meant to limit the scope of the invention which is limited only by the following claims.

What is claimed is:

1. A method for removing discontinuities between the data of a first and second data set acquired in a k-space for a same MRI image of a subject, wherein the data for each of the data sets is acquired at k-coordinate points in adjacent regions of the k-space, using different MRI imaging techniques or operating conditions, and wherein the discontinuities occur at k-coordinates along a boundary between the adjacent regions of the k-space, comprising:
   (a) determining a width for a transition zone in the k-space plane, at and including the boundary;
   (b) replacing data at k-coordinates in the transition zone with bridging data that provides a continuous transition from data of the first data set at k-coordinates outside of and along an edge of the transition zone to data of the second data set at k-coordinates outside of and along the opposite edge of the transition zone; and
   (c) wherein replacing data in the transition zone with bridging data comprises:
      (i) acquiring a first transition data set at coordinate points in the transition zone using the MRI imaging technique or operating conditions of the first data set and acquiring a second transition data set at coordinate points in the transition zone using the MRI technique for the second data set or conditions of the second data set; and
      (ii) calculating the bridging data using data from the first and second transition data sets for a plurality of k-coordinates in the transition zone by obtaining a weighted average between data from the first transition set and data from the second transition set by employing a linear weighting function.

2. A method for removing discontinuities according to claim 1 and wherein said linear weighting function is $\overline{S}(k_x,k_y)=[(k_y-k_0)/w+1/2]\times S_1(k_x,k_y)+[(k_0-k_y)/w+1/2]\times S_2(k_x,k_y)$; where:
   $S_1(k_x,k_y)$ and $S_2(k_x,k_y)$ denote the two data subsets of $S(k_x,k_y)$ that overlap in the transition zone;
   $S_1(k_x,k_y)$ is the data subset which has data acquired at read points for which $k_y \geq k_0+w/2$;
   $S_2(k_x,k_y)$ is the data subset which has data acquired at read points for which $k_y \leq k_0-w/2$; and $\overline{S}(k_x,k_y)$ is the value of the transition data for $S(k_x,k_y)$ at read point $(k_x,k_y)$.

3. A method according to claim 1 wherein the data for the first and second transition data sets are acquired at substantially coincident k-coordinates in the transition zone.

4. A method according to claim 1 wherein calculating bridging data for a particular k-coordinate in the transition zone comprises calculating a weighted average between data from the first transition data set and data from the second transition data set using a weighting function.

5. A method according to claim 1, wherein acquiring data using different operating conditions comprises using the same MRI technique at different and separate time periods.

6. A method according to claim 3, wherein acquiring data using different operating conditions comprises using the same MRI technique at different and separate time periods.

7. A method according to claim 1, wherein the first data set is acquired using an EPI sequence.

8. A method according to claim 1, wherein the second data set is acquired using a GRASE sequence.

9. A method according to claim 1, wherein said transition zone width is at least 10% of the width of the smaller of the two data sets.

10. A method according to claim 1, wherein said transition zone width is at least 25% of the width of the larger of the two data sets.

11. A method according to claim 1, wherein said transition zone width is at least 25% of the width of the smaller of the two data sets.

12. A method according to claim 1, wherein said transition zone width is determined responsive to data in at least one of said data sets.

13. A method for removing discontinuities between the data of a first and second data set acquired in a k-space for a same MRI image of a subject, wherein the data for each of the data sets is acquired at k-coordinate points in adjacent regions of the k-space, using different MRI imaging techniques or operating conditions, and wherein the discontinuities occur at k-coordinates along a boundary between the adjacent regions of the k-space plane, comprising:

(a) acquiring data for an overlap data set at k-coordinates in an overlap zone along the boundary, in at least one of the adjacent areas of the k-space plane, using the MRI technique or operating conditions used to acquire data in the other adjacent area of the k-space plane;

(b) calculating bridging data from data in the overlap data set for k-coordinates in the overlap zone that provide a continuous transition from data of the first data set at k-coordinates outside of and along the opposite edge of the overlap zone to data of the second data set at k-coordinates outside of and along the opposite edge of the overlap zone; wherein calculating bridging data comprises calculating a weighted average between data in the overlap zone acquired using the MRI imaging techniques or operating conditions of the first data set and data acquired in the overlap zone using the MRI imaging technique or operating conditions of the second data set using a linear weighting function; and (c) replacing data from the first and second data sets at k-coordinates in the overlap zone with said bridging data.

14. A method according to claim 13 wherein data for the overlap data set is acquired at k-coordinates substantially coincident with the k-coordinates of data in the overlap zone from the first or second data sets.

15. A method according to claim 13, wherein different operating conditions comprises using the same MRI technique at different separate time periods.

16. A method according to claim 13, wherein the first data set is acquired using an EPI sequence.

17. A method according to claim 13, wherein the second data set is acquired using a GRASE sequence.

18. A method for removing discontinuities according to claim 13 and wherein said linear weighting function is $\overline{S}(k_x,k_y)=[(k_y-k_0)/w+1/2]\times S_1(k_x,k_y)+[(k_0-k_y)/w+1/2]\times S_2(k_x,k_y)$; where:

$S_1(k_x,k_y)$ and $S_2(k_x,k_y)$ denote the two data subsets of $S(k_x,k_y)$ that overlap in the transition zone;

$S_1(k_x,k_y)$ is the data subset which has data acquired at read points for which $k_y \geq k_0+w/2$;

$S_2(k_x,k_y)$ is the data subset which has data acquired at read points for which $k_y \leq k_0-w/2$; and $\overline{S}(k_x,k_y)$ is the value of the transition data for $S(k_x,k_y)$ at read point $(k_x,k_y)$.

* * * * *